(12) United States Patent
Rector

(10) Patent No.: US 7,403,758 B2
(45) Date of Patent: Jul. 22, 2008

(54) LINEARIZED AND BALANCED MIXER APPARATUS AND SIGNAL MIXING METHOD

(75) Inventor: Stephen J. Rector, Tempe, AZ (US)

(73) Assignee: Freescale Semicondutor, Inc., Austin, TX (US)

( * ) Notice: Subject to any disclaimer, the term of this patent is extended or adjusted under 35 U.S.C. 154(b) by 473 days.

(21) Appl. No.: 11/243,633

(22) Filed: Oct. 4, 2005

(65) Prior Publication Data

US 2007/0077907 A1    Apr. 5, 2007

(51) Int. Cl.
*H04B 1/26* (2006.01)

(52) U.S. Cl. ............ 455/232.1; 455/323; 455/455; 455/333

(58) Field of Classification Search ........... None
See application file for complete search history.

(56) References Cited

U.S. PATENT DOCUMENTS

| | | | |
|---|---|---|---|
| 4,720,685 A | 1/1988 | Garuts | |
| 5,497,123 A | 3/1996 | Main et al. | |
| 5,532,637 A | 7/1996 | Khoury et al. | |
| 5,548,840 A | 8/1996 | Heck | |
| 5,729,176 A | 3/1998 | Main et al. | |
| 5,886,547 A | 3/1999 | Durec et al. | |
| 6,125,272 A | 9/2000 | Bautista et al. | |
| 6,157,822 A | 12/2000 | Bastani et al. | |
| 6,798,289 B2 * | 9/2004 | McGinn | 455/214 |
| 2004/0145415 A1 * | 7/2004 | Sun | 330/295 |

* cited by examiner

*Primary Examiner*—Thanh Cong Le
(74) *Attorney, Agent, or Firm*—Ingrassia, Fisher & Lorenz, P.C.

(57) ABSTRACT

Method and apparatus are provided for linearized balanced signal mixing. A signal mixing circuit (10) for translating a radio frequency (RF) signal is provided comprising an input amplifier (12), a mixer network (14), and an output buffer amplifier (18). The input amplifier (12) is configured to produce an amplified RF signal and cancel an input third-order intermodulation (IM3) distortion in the amplified RF signal with a cross-coupled feedback amplifier (13). The mixer network (14) is configured to produce an intermediate frequency (IF) signal based on the amplified RF signal and a local oscillator signal. The output amplifier (18) is configured to buffer the IF signal and cancel an output IM3 distortion in the IF signal with a cross-coupled feedback amplifier (19). The input amplifier (12) and cross-coupled feedback amplifier (13) also serve as a bias current source for the mixer network (14), thus lowering the supply voltage required for the mixing circuit (10).

20 Claims, 4 Drawing Sheets

LINEARIZED AND BALANCED MIXER APPARATUS AND SIGNAL MIXING METHOD

FIELD OF THE INVENTION

The present invention generally relates to communications, and more particularly relates to low power and low noise mixer circuits and related methods in communications.

BACKGROUND OF THE INVENTION

Mixer circuits, or mixers, are widely used in modern communication systems to translate the frequency of an input signal up or down to an Intermediate Frequency (IF) where further signal processing and demodulation can occur. This translation function is referred to herein as a frequency down-conversion or up-conversion when applied to the signal path of a receiver or transmitter. In a receiver, a front end mixer multiplies the input Radio Frequency (RF) signal with an internal Local Oscillator (LO) signal to produce sum and difference frequencies (e.g., f(mixer out)=±f(RF)±f(LO)), one of which is chosen as the desired IF. The undesired response, referred to herein as an image frequency, is typically filtered out. The IF signal is more easily amplified, processed, and ultimately demodulated because the IF frequency is predetermined.

A common circuit for performing the mixer function in a receiver is a Gilbert Cell. In one example of a Gilbert Cell mixer circuit, an RF input signal is fed to a differential transconductance amplifier (e.g., Metal Oxide Semiconductor (MOS) differential amplifier) having a supply current determined by a bias source. The current in the bias source is typically established by a bias voltage (e.g., $V_{bias}$). The mixer core of the Gilbert Cell receives local oscillation signals at differential inputs (e.g., LO(+) and LO(−)). The differential transconductance amplifier modulates the differential current in the mixer core by the RF input signal (e.g., RF(+) and RF(−)). At a differential load coupled to the output of the mixer core, an output signal is provided consisting of the RF input signal switched by the mixer core at the rate of the LO frequency. The output signal corresponds to the frequency difference between the RF and LO signals.

During frequency conversion, the Gilbert Cell mixer may generate intermodulation (IM) distortion when multiple signals are present at the RF port. When the input and output circuits of the mixer are nonlinear, undesired multiplication of the RF and IF signals with each other occurs producing spurious frequencies which comprise the IM distortion component of the mixer output. Second-order intermodulation (IM2) and third-order intermodulation (IM3) distortions may pass to the mixer output and corrupt the instantaneous amplitude and phase of the desired IF signal. A third order IM intercept point (IIP3) for this Gilbert cell circuit is given by the following equation:

$$IIP3_{dBm} = 10 + 10 \cdot \log\left(\frac{32}{3} \cdot \frac{I_{ss}}{\mu_n \cdot C_{ox} \cdot \frac{W}{L}}\right) - 10 \cdot \log\left(\frac{R_{in}}{50}\right) \quad \text{Eq. 1}$$

where $IIP3_{dBm}$ is the third order IM intercept point expressed in decibels in relative to a milliwatt, $I_{ss}$ is a source current for the differential transconductance amplifier (e.g., MOS differential amplifier), $\mu_n$ is the carrier mobility of electrons in the MOS channel, $C_{ox}$ is a MOS gate capacitance per unit area, W is an effective width of the MOS channel, L is an effective length of the MOS channel, and $R_{in}$ is a mixer RF port input resistance.

Eq. 1 illustrates an inverse relationship between IIP3 and the gain, which is proportional to W/L, as well as a positive proportionality of IIP3 to the supply current ($I_{ss}$). In a low voltage, low power operating regime, such as may be found in a cellular communication device or a portable electronic device, it is desirable to maintain or improve gain while decreasing supply current demands. The design trade-offs for increasing mixer linearity at low voltage often sacrifices gain and low supply current drain.

Accordingly, a signal mixing circuit is desired that optimizes linearization under relatively low supply voltage and low supply power conditions. In addition, a method for signal mixing is desired that optimizes linearization under a relatively low supply voltage and low supply power condition. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

Figure 1:
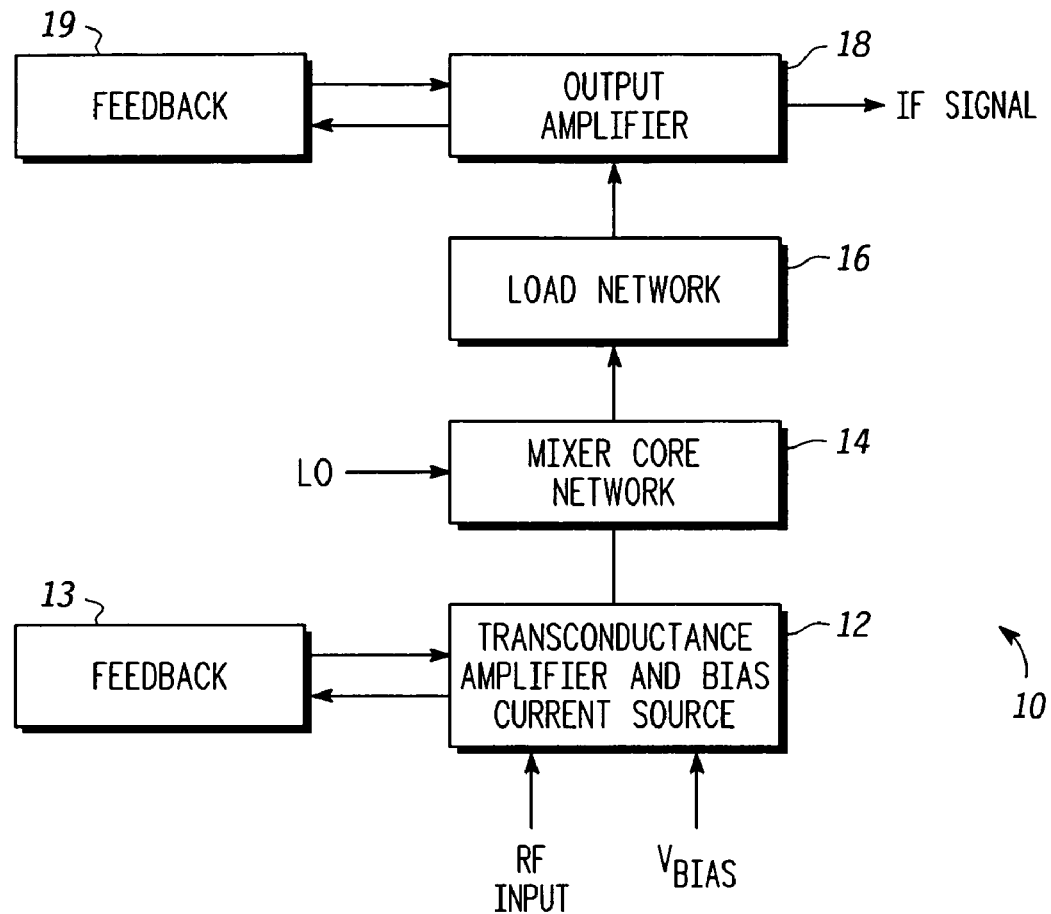
FIG. 1 is a block diagram of an exemplary embodiment of a balanced mixer circuit in accordance with the present invention.

Referring to the drawings, FIG. 1 is a block diagram of an exemplary embodiment of a balanced mixer circuit 10 in accordance with the present invention. Balanced mixer circuit 10 comprises an input amplifier 12, a Gilbert mixer core network 14 coupled to the input amplifier 12, a load network 16 coupled to Gilbert mixer core network 14, and an output amplifier 18 coupled to load network 16. Input amplifier 12 is a differential transconductance amplifier and also serves as a bias current source for Gilbert mixer core network 14. Balanced mixer circuit 10 has differential inputs for receiving a Radio Frequency (RF) input signal (e.g., $RF_{IN}^+$ and $RF_{IN}^-$) and a Local Oscillator (LO) signal (e.g., $LO_{IN}^+$ and $LO_{IN}^-$) and has differential outputs to provide a differential output signal (e.g., $IF_{OUT}^+$ and $IF_{OUT}^-$).

At the input of balanced mixer circuit 10, input amplifier 12 is coupled to the differential inputs configured to receive the RF input signal and has an additional input configured to receive a bias control voltage (e.g., $V_{BIAS}$). Input amplifier 12 amplifies the differential RF input voltage, associated with the RF input signal, and converts this voltage to a differential current. Additionally, input amplifier 12 incorporates a differential feedback amplifier 13 that provides cancellation of an input third-order intermodulation distortion (IM3) with minimal cost to gain, noise figure, and supply current associated with differential transconductance amplifier 12.

The differential current from input amplifier 12 is received by Gilbert mixer core network 14 via an RF input port coupled to an output of differential transconductance amplifier 12. Gilbert mixer core network 14 includes the differential inputs configured to receive the LO input signal (e.g., $LO_{IN}^+$ and $LO_{IN}^-$). Gilbert mixer core network 14 multiplies, or mixes, the differential current with the LO input signal (e.g., $LO_{IN}^+$ and $LO_{IN}^-$) and delivers the resulting mixed signal (e.g., a differential IF output signal) as a current to load network 16. Load network 16 converts the current of the mixed signal to a voltage, and output amplifier 18 buffers the mixed signal (e.g., isolates the mixed signal from loading effects) to an output of load network 16. Additionally, output amplifier 18 incorporates a differential feedback amplifier configured to independently cancel an output IM3 of the mixer IF output signal. Although balanced mixer circuit 10 produces a differential IF output signal from the RF input signal, a baseband signal may also be produced from the RF input signal in another exemplary embodiment.

Figure 2:
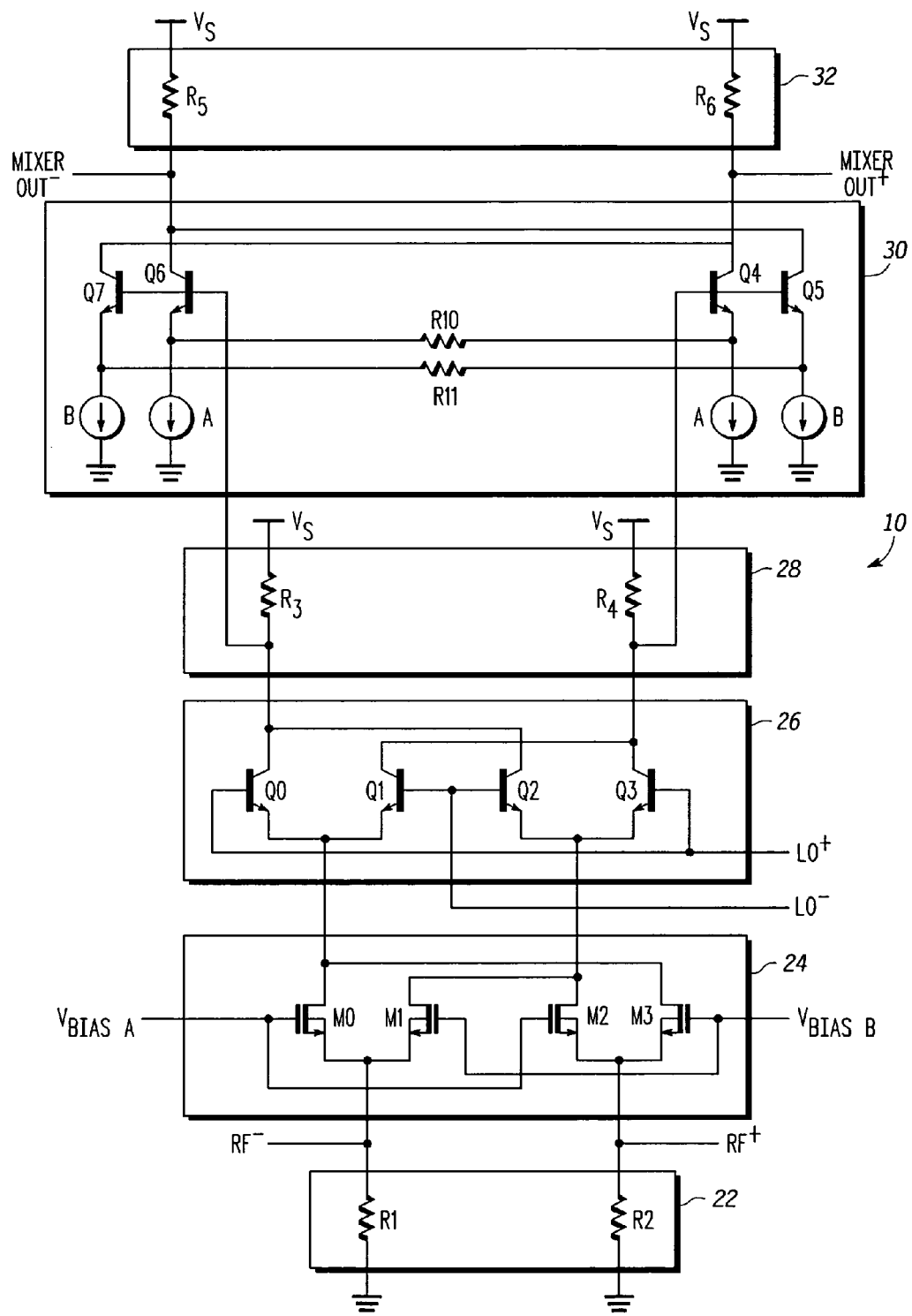
FIG. 2 is a schematic diagram of the balanced mixer circuit shown in FIG. 1 in accordance with an exemplary embodiment of the present invention.

FIG. 2 is a schematic diagram of the balanced mixer circuit 10 shown in FIG. 1 in accordance with an exemplary embodiment of the present invention. Generally, balanced mixer circuit 10 comprises an input load network 22, an input amplifier 24 coupled to input load network 22, a Gilbert mixer core network 26 coupled to input amplifier 24, a mixer load network 28 coupled to Gilbert mixer core network 26, an output buffer amplifier 30 coupled to load network 28, and an output load network 32 coupled to output buffer amplifier 30. Referring to FIGS. 1 and 2, input amplifier 24 has three primary functions of feedback amplifier 13 and transconductance amplifier and bias current source 12, Gilbert mixer core network 26 corresponds to mixer core network 14, mixer load network 28 corresponds to load network 16, and output buffer amplifier 30 has dual primary functions of feedback amplifier 19 and output amplifier 18.

The RF input impedance of balanced mixer circuit 10 is set by a combination of input load network 22 and the impedance associated with input amplifier 24. In an exemplary embodiment, input load network 22 comprises resistors R1 and R2. A first terminal of each of resistors R1 and R2 is configured to receive a first reference potential (e.g., a ground), and a second terminal of each of resistors R1 and R2 is coupled to the differential RF inputs of the balanced mixer circuit 10. The RF input impedance of balanced mixer circuit 10 is set by the parallel combination of resistors R1 and R2 with the source impedances of the transistor pairs M0, M1 and M2, M3, respectively, described hereinafter. Although input load network 22 comprises resistors R1 and R2, input load network 22 may comprise inductances, tank circuits, or the like.

Input amplifier 24 is a differential transconductance amplifier having differential inputs and comprising transistors M0, M1, M2, and M3. Transistors M0 and M2 provide the main transconductance amplification for input to Gilbert mixer core network 26 by amplifying the differential RF input signal (e.g., RF+ and RF−) at the sources of transistor pairs M0, M1 and M2, M3. The bias current for M0 and M2 is controlled by the voltage received at $V_{biasA}$. Transistors M1 and M3 are biased at a substantially lower supply current, controlled by the voltage at $V_{biasB}$, and transistors M1 and M3 have a significantly lower transconductance than transistors M0 and M2 such that the negative contribution by transistors M1 and M3 to the total transconductance of input amplifier 24 is relatively small. The size of transistors M1 and M3 and the bias potential ($V_{biasA}$) are selected to cancel IM3. $V_{biasA}$ and $V_{biasB}$ are provided by a variety of conventional means (e.g., bandgap circuit) and the voltage values are preferably set at the time of fabrication of manufacture of balanced mixer circuit 10 and may be trimmable. The drains of transistors M1 and M3 are coupled in reverse polarity (e.g., cross-coupled) to the drains of transistors M0 and M2, respectively (e.g., the drains of M1 and M2 are coupled together and the drains of M0 and M3 are coupled together), the sources of transistors M0 and M1 are coupled together, and the sources of transistors M2 and M3 are coupled together.

The net transconductance of input amplifier 24 is based on the difference of the transconductance of transistor pair M1 and M3 and the transconductance of transistor pair M0 and M2. The bias current and transconductance of transistor pair M1 and M3 are preferably set to a value to equalize the third-order intermodulation distortion (IM3) magnitude of the RF input signal at the drains of transistors M1 and M3 with the IM3 magnitude at the drains of transistors M0 and M2. Transistors M1 and M3 operate as feedback amplifier 13 shown in FIG. 1 by supplying an opposite (e.g., one-hundred and eighty degrees (180°) out of phase) IM3 component to cancel the IM3 component produced by transistors M0 and M2. The outputs (e.g., drains) of the transistor pairs M0, M1 and M2, M3 are coupled in differentially opposing polarity, thus canceling the IM3 component of the composite RF output signal introduced to Gilbert mixer core network 26. This configuration of transistors M0, M1, M2, and M3 increases the linearity of balanced mixer circuit 10 with relatively less cost in gain and supply current when compared with conventional degenerative techniques.

Gilbert mixer core network 26 comprises transistors Q0, Q1, Q2, and Q3. The bases of transistors Q0 and Q3 are coupled to form the LO+ input, and the bases of transistors Q1 and Q2 are coupled to form the LO− input. The collectors of transistors Q1 and Q3 are coupled together to form a first differential output of Gilbert mixer core network 26, and the collectors of transistors Q0 and Q2 are coupled together to form a second differential output of Gilbert mixer core mixer network 26. The first and second differential outputs of Gilbert mixer core network 26 are configured to deliver internal signals (e.g., INT_IF− and INT_IF+) to output amplifier 30. Mixer load network 28 is coupled to the differential outputs of Gilbert mixer core network 26 and comprises resistors R3 and R4. A first terminal of each of resistors R3 and R4 is configured to receive a supply voltage (e.g., $V_s$), and a second terminal of each of resistors R3 and R4 is coupled to the differential outputs of Gilbert mixer core network 26 and the differential inputs of output buffer amplifier 30.

Output buffer amplifier 30 produces an IF output signal at the differential outputs (e.g., Mixer Out− and Mixer Out+) and comprises a primary emitter-coupled transistor pair Q4 and Q6 biased by a current source A and having an emitter degeneration resistance R10, and a transistor pair Q5 and Q7 coupled in parallel with transistor pair Q4 and Q6 and biased by a current source B and having an emitter degeneration resistance R11. Current sources A and B are provided by a variety of conventional and the current values are preferably set at the time of fabrication or manufacture of balanced mixer circuit 10 and may be trimmable. Output load network 32 comprises resistive loads R5 and R6 coupled at the mixer output. The collectors of transistor pair Q5 and Q7 are coupled in opposing polarity (e.g., cross-coupled) with the collectors of transistor pair Q4 and Q6 (e.g., the collectors of Q5 and Q6 are coupled together and the collectors of Q4 and Q7 are coupled together). Output load network 32 is coupled to the differential outputs of output amplifier 30 and comprises resistors R5 and R6. A first terminal of each of resistors R5 and R6 is configured to receive a supply voltage (e.g., $V_s$), and a second terminal of each of resistors R5 and R6 is coupled to the differential outputs of output amplifier 30. In addition to the resistances, output load network 32 may also comprise inductances or tank circuits.

In output buffer amplifier 30, primary transistor pair Q4 and Q6 provides the main amplification for the mixer output, while transistor pair Q5 and Q7 is biased at a substantially lower supply current to minimize the negative contribution to the differential output (e.g., Mixer Out− and Mixer Out+) gain. The ratio if current B to current A and the ratio of R11 to R10 are selected for IM3 cancellation. For example, the bias current and transconductance of transistor pair Q5 and Q7, degenerated by resistor R11, is preferably set to a value that substantially equalizes the IM3 magnitude of the IF signal at the collectors of transistor pair Q5 and Q7 with the IM3 magnitude at the collectors of transistor pair Q4 and Q6. Transistor pair Q5 and Q7 operates as feedback amplifier 19 shown in FIG. 1 by supplying an opposite (e.g., one-hundred and eighty degrees (180°) out of phase) IM3 component to cancel the IM3 component produced by transistors Q4 and Q6. The outputs (e.g., collectors) of transistor pairs Q4, Q6 and Q5, Q7 are coupled to each other in differentially opposing polarity, thus canceling the IM3 component of the composite IF output signal at Mixer Out− and Mixer Out+. This configuration of transistors Q4, Q5, Q6, and Q7 in output amplifier 30 increases the mixer linearity at the mixer output (e.g., Mixer Out− and Mixer Out+). Additionally, the IM3 cancellation at output amplifier 30 is performed independently from the IM3 cancellation at input amplifier 24, and the two cancellation circuits may be adjusted for optimization of balanced mixer circuit 10 linearity for a given set of constraints for the supply voltage, current, noise figure, and the like, associated with balanced mixer circuit 10.

Figure 3:
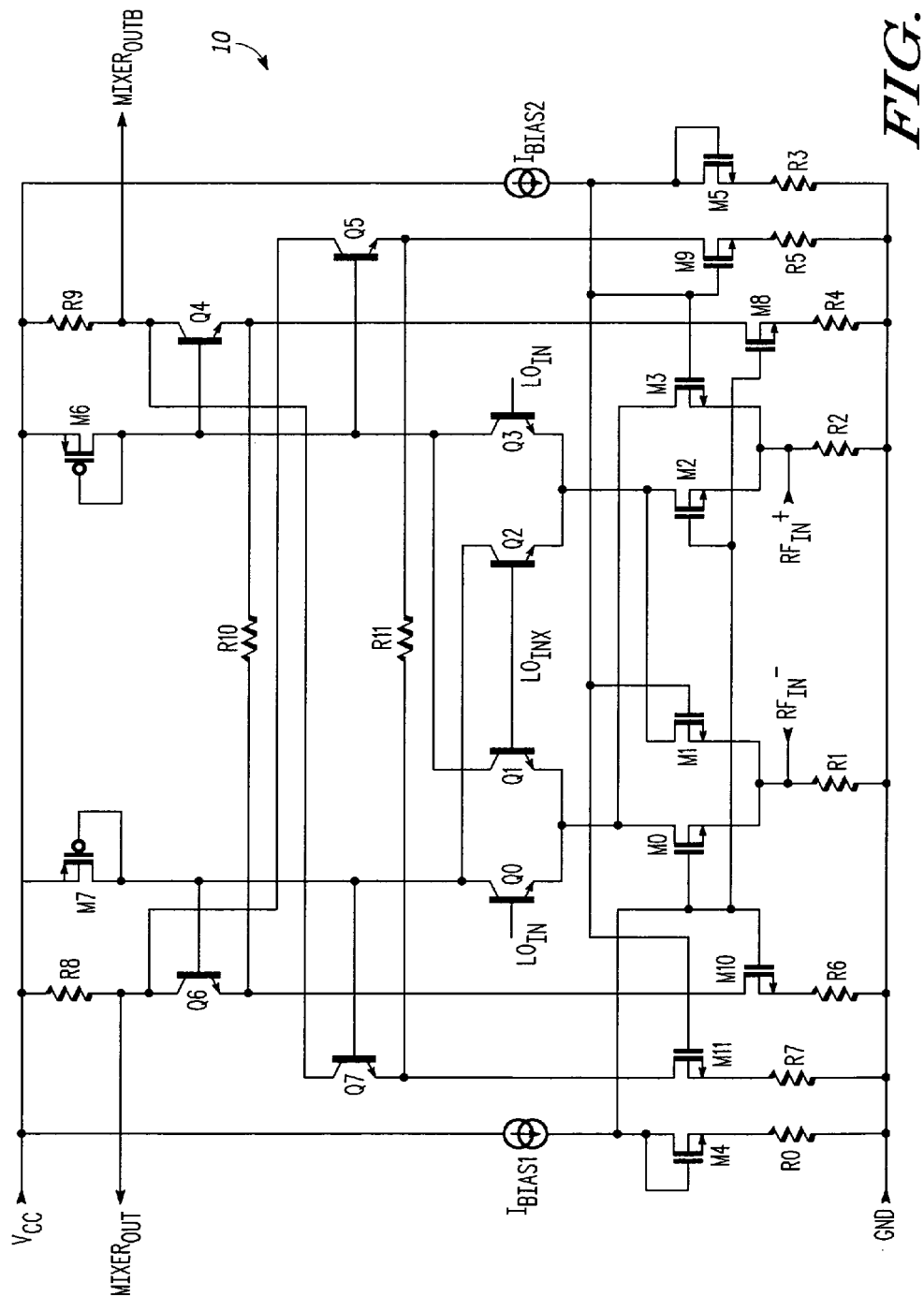
FIG. 3 is a circuit diagram of a detailed exemplary embodiment of the balanced mixer circuit shown in FIGS. 1 and 2.

FIG. 3 is a circuit diagram of a detailed exemplary embodiment of the balanced mixer circuit 10 shown in FIGS. 1 and 2. Referring to FIGS. 2 and 3, first and second current sources ($I_{BIAS1}$, $I_{BIAS2}$) provide the bias potentials (e.g., $V_{BIAS\_A}$ and $V_{BIAS\_B}$) to input amplifier 24, shown in FIG. 2, via a bias network. The bias network comprises transistors M4, M5, M8, M9, M10, and M11, as well as transistors M0, M1, M2, and M3. Transistor M4 has a drain coupled to the output of current source ($I_{BIAS1}$), transistor M11 has a drain coupled to the emitter of transistor Q7, transistor M10 has a drain coupled to the emitter of transistor Q6, transistor M8 has a drain coupled to the emitter of transistor Q4, transistor M9 has a drain coupled to the emitter of transistor Q5, and transistor M5 has a drain terminal coupled to the output of current source ($I_{BIAS2}$). Additionally, each of transistors M0, M1, M2, M3, M4, M5, M8, M9, M10, and M11 is coupled to a reference potential (e.g., ground) via a resistor R0, R1, R2, R3, R4, R5, R6, and R7, respectively. The gates of transistors M4, M10, and M8 and the gates of transistors M0 and M2 are coupled together. The gates of transistors M5, M9, and M11 and the gates of transistors M1 and M3 of input amplifier 24 are coupled together. Current sources ($I_{BIAS1}$, $I_{BIAS2}$) have outputs coupled to the drain terminals of transistors M4 and M5, respectively.

In addition to the use of the bias network in this exemplary embodiment, mixer load network 28, shown in FIG. 2, comprises transistors M7 and M6 coupled to the differential outputs of Gilbert mixer core network 26. Transistor M7 has a source configured to receive the supply voltage (e.g., $V_{cc}$), a drain coupled to the collector of transistors Q0 and Q2, and a gate coupled to the drain of transistor M7 via an inverter. Transistor M6 has a source configured to receive the supply voltage (e.g., $V_{cc}$), a drain coupled to the collector of transistors Q1 and Q3, and a gate coupled to the drain of transistor M6 via an inverter.

Figure 4:
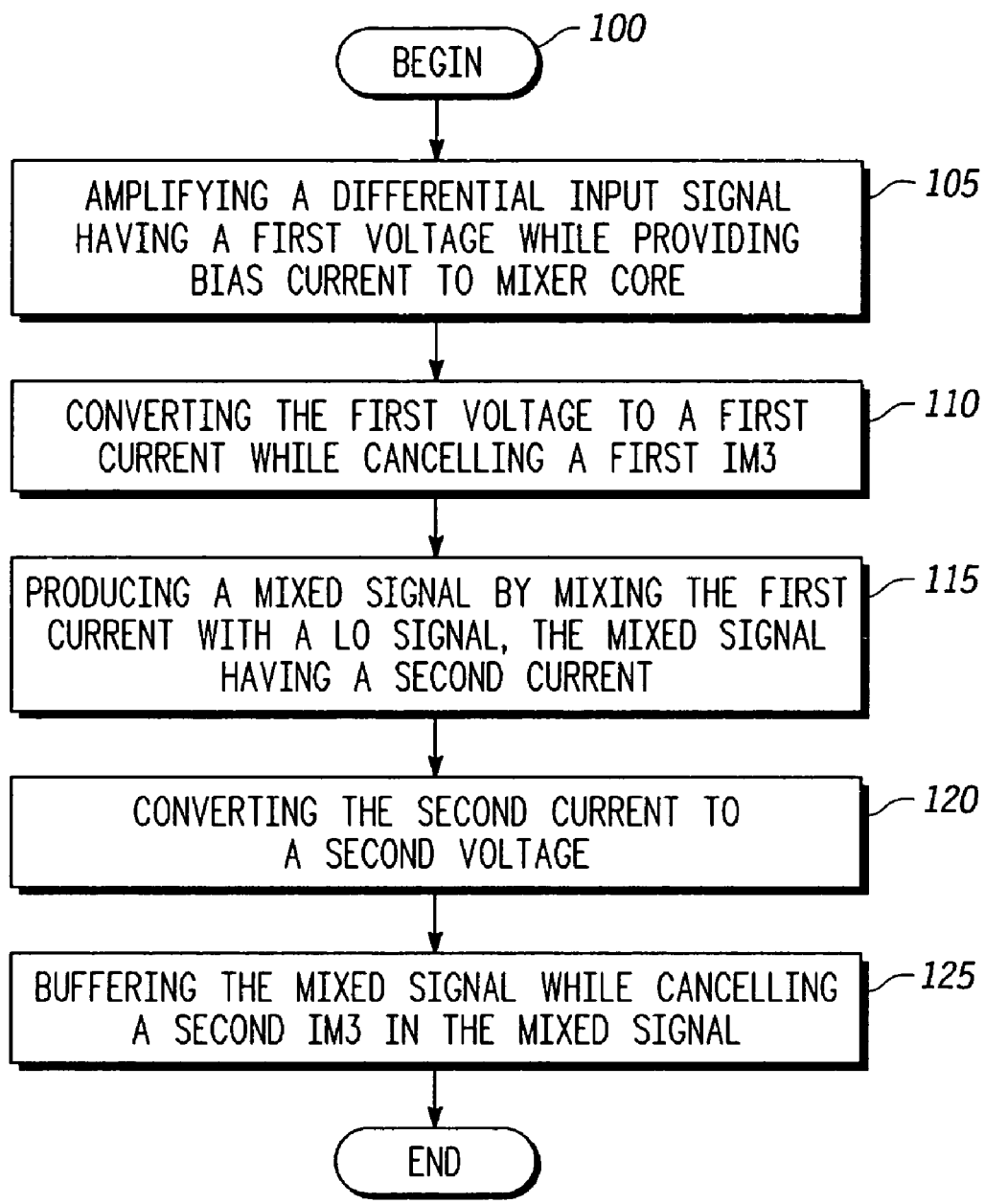
FIG. 4 is a flow diagram of a method of signal mixing in accordance with an exemplary embodiment of the present invention.

FIG. 4 is a flow diagram of a method of signal mixing in accordance with an exemplary embodiment of the present invention. The method begins at step 100. Referring to FIGS. 2 and 4, input amplifier 24 amplifies the RF input signal (e.g., RF− and RF+) at step 105. Cross-coupled transistor pairs M0, M2 and M1, M3 amplify the RF input signal. The bias current for transistor pair M0 and M2 is preferably selected to be greater than the bias current for transistor pair M1 and M3, and the bias current for transistor pair M1 and M3 is more preferably selected to equalize the IM3 magnitude of the RF input signal at the drains of transistors M1 and M3 with the IM3 magnitude of the RF input signal at the drains of transistors M0 and M2. The RF input signal has a voltage associated therewith. Input amplifier 24 converts the voltage of the RF input signal to a current while canceling the input IM3 at step 110. Gilbert mixer core network 26 produces a mixed signal by mixing the current from input amplifier 24 with an oscillation signal (e.g., LO+ and LO−) at step 115. The mixed signal has a current associated therewith. Mixer load network 28 converts the current of the mixed signal to a voltage at step 120. Output amplifier 30 buffers the mixed signal while canceling the output IM3 in the IF output signal at step 125. In one exemplary embodiment, cross-coupled transistor pairs Q4, Q6 and Q5, Q7 produce the output IF signal. The bias current for transistor pair Q4 and Q6 is preferably selected to be greater than the bias current for transistor pair Q5 and Q7, and the bias current for transistor pair Q5 and Q7 is more preferably selected to equalize the IM3 magnitude of the IF signal at the collectors of transistors Q5 and Q7 with the IM3 magnitude of the IF signal at the collectors of transistors Q4 and Q6.

In general, a mixer circuit is provided having an input amplifier stage and an output stage. The input amplifier stage performs input amplification, mixer bias control, and third-order Intermodulation Distortion (IMD) cancellation using a cross-coupled differential transistor pair. This combination of three functions associated with this cross-coupled differential transistor pair reduces the supply voltage that the mixer circuit draws during operation. Additionally, the mixer circuit incorporates an additional third-order Intermodulation (IM3) cancellation at the output stage that is independently adjustable with respect to the input amplifier stage such that a composite mixer IIP3 can be optimized for a given supply voltage and current requirement.

In an exemplary embodiment, a signal mixing circuit is provided for translating a radio frequency (RF) signal. The signal mixing circuit comprises a input amplifier having an input configured to receive the RF signal and having an output, and a mixer network having a first input coupled to the output of the input amplifier and having a second input configured to receive a local oscillator (LO) signal. The input amplifier is configured to produce an amplified RF signal, source a bias current to the mixer network, and cancel an input third-order intermodulation (IM3) distortion in the amplified RF signal. The mixer network is configured to produce a first IF signal based on the amplified RF signal and the LO signal, the IF signal having a first current. The load network is configured to convert the first current to a first voltage. The output amplifier is configured to produce a second IF signal at the output of the output amplifier. The signal mixing circuit further comprises an output amplifier having an input coupled to the output of the mixer network and having an output, and a load network having an input coupled to an output of the mixer network and having an output coupled to the input of the output amplifier. The RF signal has a voltage, and the input differential amplifier is further configured to convert the voltage to a current, the amplified RF signal having the current. The input amplifier comprises a first feedback amplifier configured to cancel the IM3 distortion in the amplified signal, and wherein the output amplifier comprises a second feedback amplifier configured to cancel the IM3 distortion in the first IF signal. The first feedback amplifier is biased independently from the second feedback amplifier. The input amplifier comprises a first pair of transistors configured to source a first bias current, and a second pair of transistors configured to source a second bias current less than the first bias current. The first pair of transistors has a first pair of sources and a first pair of drains. The second pair of transistors has a second pair of sources coupled to the first pair of sources in a first polarity and has a second pair of drains coupled to the first pair of drains in a second polarity. The first pair of transistors is configured to produce an IM3 distortion and the second pair of transistors is configured to produce an IM3 distortion substantially equal to and opposite the IM3 distortion of the first pair of transistors when the second pair of transistors sources the second bias current. The output amplifier comprises a first pair of transistors configured to receive a first bias current, and a second pair of transistors configured to receive a second bias current less than the first bias current. The first pair of transistors has a first pair of emitters and a first pair of collectors. The second pair of transistors has a second pair of emitters coupled to the first pair of emitters in a first polarity and has a second pair of collectors coupled to the first pair of collectors in a second polarity. The first pair of transistors is configured to produce an IM3 distortion and the second pair of transistors is configured to produce an IM3 distortion substantially equal to and opposite the IM3 distortion of the first pair of transistors when the second pair of transistors receives the second bias current.

In another exemplary embodiment, a signal mixing method is provided comprising the steps of amplifying a differential input signal with an amplifier to produce an amplified RF signal, providing a bias current to a mixer core with the amplifier concurrently with the amplifying step, canceling an first IM3 distortion in the differential input signal, producing a mixed signal by mixing the amplified RF signal with an LO signal, and canceling a second IM3 distortion in the mixed signal. The amplifying step comprises amplifying the differential input signal via first and second pairs of cross-coupled transistors, selecting a first bias current of the first pair of the cross-coupled transistors, and selecting a second bias current of the second pair of cross-coupled transistors, the second bias current substantially lower than the first bias current. The step of selecting the second bias current comprises selecting the second bias current to equalize an IM3 magnitude at a current output of the second pair of cross-coupled transistors with an IM3 magnitude at a current output of the first pair of cross-coupled transistors. The method further comprises amplifying the mixed signal via first and second pairs of cross-coupled transistors, selecting a first bias current of the first pair of the cross-coupled transistors, and selecting a second bias current of the second pair of cross-coupled transistors, the second bias current substantially lower than the first bias current. The step of selecting the second bias current comprises selecting the second bias current to equalize an IM3 magnitude at a current output of the second pair of cross-coupled transistors with an IM3 magnitude at a current output of the first pair of cross-coupled transistors.

In yet another exemplary embodiment, a signal mixing circuit comprises an input amplifier, a mixer network, and an output amplifier. The input amplifier has a first input configured to receive an RF signal having a first voltage, a second input configured to receive a bias potential, and an output. The mixer network has a first input configured to receive an LO signal, a second input coupled to the output of the input amplifier, and an output. The output amplifier has an input coupled to the output of the mixer network and has an output. The input amplifier is configured to produce an amplified RF signal from the RF signal, and cancel an IM3 distortion at its output. The mixer network is configured to multiply the LO signal with the amplified RF signal to produce a first signal. The output amplifier is configured to produce a second signal by amplifying the first signal and cancel an IM3 distortion in the second signal. The signal mixing circuit further comprises a first load network having a first terminal configured to couple to a first reference potential and having a second terminal coupled to said first input of said input amplifier, a second load network having a first terminal coupled to the output of the mixer network and having a second terminal configured to couple to a second reference potential, and a third load network having a first terminal coupled to the output of the output amplifier and having a second terminal configured to couple to the second reference potential. The input amplifier comprises a feedback amplifier. The input amplifier comprises a first transistor, a second transistor, a third transistor, and a fourth transistor. The first transistor has a gate configured to receive a first bias potential, a source, and a drain. The second transistor has a gate configured to receive a second bias potential, a source coupled to the source of the first transistor to form a first differential RF input, and a drain. The third transistor has a gate configured to receive the first bias potential, a source, and a drain coupled to the drain of the second transistor to form a first differential current output. The fourth transistor has a gate configured to receive the second bias potential, a source coupled to the source of the third transistor to form a second differential RF input, and a drain coupled to the drain of the first transistor to form a second differential current output. The first transistor and the third transistor are configured to produce an IM3 distortion and the second transistor and the fourth transistor have an IM3 substantially equal to and opposite the IM3 of the first transistor and the third transistor when the second transistor and the fourth transistor receive the second bias potential. The second transistor and fourth transistor each have a size, and the second bias potential and the sizes of the second transistor and fourth transistor are each selected to cancel the IM3 distortion of the first transistor and third transistor with the IM3 distortion of the second transistor and fourth transistor. The mixer network comprises first, second, third, and fourth transistors. The first transistor has a base configured to receive a first LO signal, an emitter coupled to the output of the input amplifier, and a collector coupled to the first terminal of the second load network and the input of the output amplifier. The second transistor has a base configured to receive a second LO signal, an emitter coupled to the emitter of the first transistor and the output of the input amplifier, and a collector coupled to the first terminal of the second load network. The third transistor has a base coupled to the base of the second transistor and configured to receive the second LO signal, an emitter coupled to the output of the input amplifier, and a collector coupled to the collector of the first transistor and the first terminal of the second load network. The fourth transistor has a base coupled to the base of the first transistor and configured to receive the first LO signal, an emitter coupled to the emitter of the third transistor and the output of the input amplifier, and a collector coupled to the collector of the second transistor and the first terminal of the second load network. The output amplifier comprises a first pair of transistors configured to receive a first bias current, and a second pair of transistors cross-coupled with the first pair of transistors and configured to receive a second bias current. The second bias current is less than the first bias current, and wherein the first pair of transistors has an IM3 distortion and the second pair of transistors has an IM3 distortion substantially equal to and opposite the IM3 distortion of the first pair of transistors when the second pair of transistors receives the second bias current. The output amplifier comprises first through fourth transistors, a first resistor having a first terminal coupled to an emitter of the second transistor and having a second terminal coupled to an emitter of the third transistor, and a second resistor having a first terminal coupled to an emitter of the first transistor and having a second terminal coupled to an emitter of the fourth transistor. The first transistor has a base coupled to the output of the mixer network and the first terminal of the second load network, the emitter configured to receive a first bias current, and a collector coupled to the first terminal of the third load network. The second transistor has a base coupled to the base of the first transistor, the emitter configured to receive a second bias current, and a collector coupled to the first terminal of the third load network. The third transistor has a base coupled to the first terminal of the second load network and the output of the mixer network, the emitter configured to receive the second bias current, and a collector coupled to the collector of the first transistor. The fourth transistor has a base coupled to the base of the third transistor, an emitter configured to receive the first bias current, and a collector coupled to the collector of the second transistor. The second transistor and the third transistor have an IM3 distortion and the first transistor and the fourth transistor have an IM3 distortion substantially equal to and opposite the IM3 distortion of the second transistor and the third transistor when the first transistor and the fourth transistor receive the second bias current. The output amplifier is configured to cancel an IM3 distortion at its output. A ratio of the first bias current to the second bias current and a ratio of the second resistor to the first resistor are each selected to cancel the IM3 distortion of the second transistor and third transistor with the IM3 distortion of the first transistor and fourth transistor.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A signal mixing circuit for translating a radio frequency (RF) signal, the signal mixing circuit comprising:
    an input amplifier having an input configured to receive the RF signal and having an output, said input amplifier configured to:
      produce an amplified RF signal;
      source a bias current; and
      cancel an input third-order intermodulation (IM3) distortion in said amplified RF signal; and
    a mixer network having first and second inputs and an output, said first input of said mixer network coupled to said output of said input differential amplifier and configured to receive said bias current, said second input configured to receive a local oscillator (LO) signal, said mixer network configured to produce a first signal based on said amplified RF signal and said LO signal.

2. A signal mixing circuit according to claim 1 further comprising:
    an output amplifier having an input coupled to said output of said mixer network and having an output, said output amplifier configured to produce a second signal from said first signal at said output of said output amplifier; and
    a load network having an input coupled to said output of said mixer network and having an output coupled to said input of said output amplifier.

3. A signal mixing circuit according to claim 1, wherein the RF signal has a voltage, and wherein said input amplifier is further configured to convert said voltage to a current, said amplified RF signal having said current.

4. A signal mixing circuit according to claim 1, wherein said input amplifier comprises a first feedback amplifier configured to cancel said IM3 distortion in said amplified signal, and wherein said output amplifier comprises a second feedback amplifier configured to cancel said IM3 distortion in said first signal, said first feedback amplifier biased independently from said second feedback amplifier.

5. A signal mixing circuit according to claim 1, wherein said input amplifier comprises:
    a first pair of transistors configured to source a first bias current, said first pair of transistors having a first pair of sources and a first pair of drains; and
    a second pair of transistors having a second pair of sources coupled to said first pair of sources in a first polarity and having a second pair of drains coupled to said first pair of drains in a second polarity, said second pair of transistors configured to source a second bias current less than said first bias current; and
    wherein said first pair of transistors is configured to produce an IM3 distortion and said second pair of transistors is configured to produce an IM3 distortion substantially equal to and opposite said IM3 distortion of said first pair of transistors when said second pair of transistors sources said second bias current.

6. A signal mixing circuit according to claim 1, wherein said output amplifier comprises:
    a first pair of transistors configured to receive a first bias current, said first pair of transistors having a first pair of emitters and a first pair of collectors; and
    a second pair of transistors having a second pair of emitters coupled to said first pair of emitters in a first polarity and having a second pair of collectors coupled to said first pair of collectors in a second polarity, said second pair of transistors configured to receive a second bias current less than said first bias current; and
    wherein said first pair of transistors is configured to produce an IM3 distortion and said second pair of transistors is configured to produce an IM3 distortion substantially equal to and opposite said IM3 distortion of said first pair of transistors when said second pair of transistors receives said second bias current.

7. A signal mixing method comprising the steps of:
    amplifying a differential input signal with an amplifier to produce an amplified RF signal;
    providing a bias current to a mixer core with the amplifier concurrently with said amplifying step;

canceling a first IM3 distortion in the differential input signal;

producing a mixed signal by mixing the amplified RF signal with a LO signal; and canceling a second IM3 distortion in the mixed signal.

8. A signal mixing method according to claim 7, wherein said amplifying step comprises:

amplifying the differential input signal via first and second pairs of cross-coupled transistors;

selecting a first bias current of the first pair of the cross-coupled transistors; and selecting a second bias current of the second pair of cross-coupled transistors, the second bias current substantially lower than the first bias current.

9. A signal mixing method according to claim 8, wherein said step of selecting the second bias current comprises selecting the second bias current to equalize an IM3 magnitude at a current output of the second pair of cross-coupled transistors with an IM3 magnitude at a current output of the first pair of cross-coupled transistors.

10. A signal mixing method according to claim 7 further comprising:

amplifying the mixed signal via first and second pairs of cross-coupled transistors;

selecting a first bias current of the first pair of the cross-coupled transistors; and selecting a second bias current of the second pair of cross-coupled transistors, the second bias current substantially lower than the first bias current.

11. A signal mixing method according to claim 10, wherein said step of selecting the second bias current comprises selecting the second bias current to equalize an IM3 magnitude at a current output of the second pair of cross-coupled transistors with an IM3 magnitude at a current output of the first pair of cross-coupled transistors.

12. A signal mixing circuit comprising:

an input amplifier having a first input configured to receive an RF signal having a first voltage, a second input configured to receive a bias potential, and an output, said input amplifier configured to:

produce an amplified RF signal from said RF signal; and cancel an IM3 distortion at said output of said input amplifier;

a mixer network having a first input configured to receive an LO signal, a second input coupled to said output of said input amplifier, and an output, said mixer network configured to multiply said LO signal with said amplified RF signal to produce a first signal;

an output amplifier having an input coupled to said output of said mixer network and having an output, said output amplifier configured to:

produce a second signal by amplifying said first signal; and cancel an IM3 distortion in said second signal at said output of said output amplifier.

13. A signal mixing circuit according to claim 12 further comprising:

a first load network having a first terminal configured to couple to a first reference potential and having a second terminal coupled to said second terminal of said first load network;

a second load network having a first terminal coupled to said output of said mixer network and having a second terminal configured to couple to a second reference potential; and a third load network having a first terminal coupled to said output of said output amplifier and having a second terminal configured to couple to said second reference potential.

14. A signal mixing circuit according to claim 12, wherein said input amplifier comprises a first feedback amplifier.

15. A signal mixing circuit according to claim 12, wherein said input amplifier comprises:

a first transistor having a gate configured to receive a first bias potential, a source, and a drain;

a second transistor having a gate configured to receive a second bias potential, a source coupled to said source of said first transistor to form a first differential RF input, and a drain;

a third transistor having a gate configured to receive said first bias potential, a source, and a drain coupled to said drain of said second transistor to form a first differential current output, said first transistor and said third transistor configured to source a first bias current; and a fourth transistor having a gate configured to receive said second bias potential, a source coupled to said source of said third transistor to form a second differential RF input, and a drain coupled to said drain of said first transistor to form a second differential current output, said second transistor and said fourth transistor configured to source a second bias current;

wherein said first transistor and said third transistor are configured to produce an IM3 distortion and said second transistor and said fourth transistor are configured to produce an IM3 distortion substantially equal to and opposite said IM3 distortion of said first transistor and said third transistor when said second transistor and said fourth transistor receive said second bias potential.

16. A signal mixing circuit according to claim 15, wherein said second transistor and said fourth transistor each have a size, and wherein said second bias potential and said size of said second transistor and said size of said fourth transistor are each selected to cancel said IM3 distortion of said first transistor and said third transistor with said IM3 distortion of said second transistor and said fourth transistor.

17. A signal mixing circuit according to claim 12, wherein said mixer network comprises:

a first transistor having a base configured to receive a first LO signal, an emitter coupled to said output of said input amplifier, and a collector coupled to said input of said output amplifier;

a second transistor having a base configured to receive a second LO signal, an emitter coupled to said emitter of said first transistor and said output of said input amplifier, and a collector coupled to said input of said output amplifier;

a third transistor having a base coupled to said base of said second transistor and configured to receive said second LO signal, an emitter coupled to said output of said input amplifier, and a collector coupled to said collector of said first transistor; and a fourth transistor having a base coupled to said base of said first transistor and configured to receive said first LO signal, an emitter coupled to said emitter of said third transistor and said output of said input amplifier, and a collector coupled to said collector of said second transistor.

18. A signal mixing circuit according to claim 12, wherein said output amplifier comprises a feedback amplifier.

19. A signal mixing circuit according to claim 12, wherein said output amplifier comprises:

a first transistor having a base coupled to said output of said mixer network, an emitter configured to receive a first bias current, and a collector;

a second transistor having a base coupled to said base of said first transistor, an emitter configured to receive a second bias current, and a collector;

a third transistor having a base coupled to said output of said mixer network, an emitter configured to receive said second bias current, and a collector coupled to said collector of said first transistor;

a fourth transistor having a base coupled to said base of said third transistor, an emitter configured to receive said first bias current, and a collector coupled to collector of said second transistor;

a first resistor having a first terminal coupled to said emitter of said second transistor and having a second terminal coupled to said emitter of said third transistor; and a second resistor having a first terminal coupled to said emitter of said first transistor and having a second terminal coupled to said emitter of said fourth transistor;

wherein said second transistor and said third transistor are configured to produce an IM3 distortion and said first transistor and said fourth transistor are configured to produce an IM3 distortion substantially equal to and opposite said IM3 distortion of said second transistor and said third transistor when said first transistor and said fourth transistor receive said second bias current.

20. A signal mixing circuit according to claim 19, wherein a ratio of said first bias current to said second bias current and a ratio of said second resistor to said first resistor are each selected to cancel said IM3 distortion of said second transistor and said third transistor with said IM3 distortion of said first transistor and said fourth transistor.

* * * * *